United States Patent

Yoshida et al.

Patent Number: 5,607,899
Date of Patent: Mar. 4, 1997

[54] METHOD OF FORMING SINGLE-CRYSTALLINE THIN FILM

[75] Inventors: Noriyuki Yoshida; Kousou Fujino; Noriki Hayashi; Shigeru Okuda, all of Osaka; Tsukushi Hara; Hideo Ishii, both of Yokohama, all of Japan

[73] Assignees: Sumitomo Electric Industries, Ltd.; The Tokyo Electric Power Company Incorporated, both of Japan

[21] Appl. No.: 393,747

[22] Filed: Feb. 24, 1995

[30] Foreign Application Priority Data

Feb. 25, 1994 [JP] Japan .................................. 6-028022
Nov. 1, 1994 [JP] Japan .................................. 6-268776

[51] Int. Cl.⁶ ............................. C30B 23/08; C30B 25/06
[52] U.S. Cl. .................... 505/474; 505/732; 204/298.13; 117/944
[58] Field of Search ..................... 505/474, 732

[56] References Cited

U.S. PATENT DOCUMENTS

| | | | |
|---|---|---|---|
| 5,037,521 | 8/1991 | Nishikawa et al. | 204/298.02 |
| 5,159,169 | 10/1992 | Nishikawa et al. | 204/298.02 |
| 5,231,075 | 7/1993 | Nagaishi et al. | 505/474 |
| 5,242,706 | 9/1993 | Cotell et al. | 204/298.02 |

FOREIGN PATENT DOCUMENTS 63-264819  11/1988  Japan .................................. 505/732
03174307   7/1991  Japan .................................. 505/732

OTHER PUBLICATIONS

Proceedings for 49th Teionkougaku Choudendou Gakkai, Spring 1993, p. 134 (with English Translation).

Yu et al. "Control of thin film orientation by glancing angle ion bombardment during growth" J. Vac. Sci. Technol. A4(3), p. 443, May/Jun. 1986.

Primary Examiner—Robert Kunemund
Attorney, Agent, or Firm—Pennie & Edmonds

[57] ABSTRACT

A thin film strongly orienting specific crystal axes is deposited on a polycrystalline or amorphous base material in accordance with laser deposition in a simpler device through a simpler process. A target is irradiated with a laser beam, for forming a thin film in accordance with laser ablation of depositing a substance scattered from the target on a base material. In order to form the thin film, prepared are conditions capable of forming a film orienting a specific crystal axis substantially perpendicularly to the base material in substantially parallel arrangement of the target and the base material. Under the conditions, a film is deposited on the base material which is inclined at a prescribed angle θ with respect to the target. It is possible to deposit a film strongly orienting a specific crystal axis in a plane substantially parallel to the base material surface by inclining the base material under the specific film forming conditions.

16 Claims, 4 Drawing Sheets

METHOD OF FORMING SINGLE-CRYSTALLINE THIN FILM

BACKGROUND OF THE INVENTION

1. Field of the Invention

The present invention relates to a method for depositing a material having high single-crystallinity on a polycrystalline or amorphous material, and more particularly, it relates to a method of forming a single-crystalline oxide thin film on a material such as a metal tape. Throughout the specification, the term "single-crystalline" indicates a state dominated by crystals having specific orientations, in relation to not only a single crystal consisting of a specific orientation but a crystalline solid, formed by a mixture of crystals having different orientations, which is dominated by crystals having specific orientations.

2. Description of the Background Art

In order to provide a substrate consisting of a specific material with a single-crystalline thin film consisting of a different material, generally employed is a single-crystalline substrate having a lattice constant which is close to that of the material for the thin film to be formed. Then, the single-crystalline thin film is grown on the single-crystalline substrate by vacuum deposition, CVD, laser deposition or the like. This technique is well known as heteroepitaxial growth.

Also in the field of a technique for forming a thin film of an oxide superconductor, known is a technique of heteroepitaxially growing an oxide superconductor, particularly an yttrium-based ceramics superconductor on a single-crystalline substrate. In relation to this technique, laser deposition is particularly noted and energetically studied. For example, it is possible to epitaxially grow an yttrium-based oxide superconductor exhibiting excellent crystal orientation on an MgO single crystal by laser ablation.

In order to form a single-crystalline thin film having desired dimensions, shape and length, on the other hand, it is necessary to employ a polycrystalline substrate which is easy to obtain. This is because it is almost impossible to prepare a long tape-shaped single-crystalline substrate for forming a long cable run by a single-crystalline thin film. However, it is difficult to form a film strongly orienting a specific crystal orientation on a polycrystalline base material.

In recent years, there has been made an attempt for preparing a superconducting wire by forming an oxide superconductor on a flexible long tape base material. The base material for the wire is generally prepared from a metal, which is a polycrystalline substance in general. When an oxide thin film is formed on such a base material by laser deposition or reactive deposition, the thin film is generally in a polycrystalline state having random orientations or in an amorphous state. Even if the thin film has natural orientations, crystals forming the thin film orient specific crystal axes perpendicularly to the surface of the base material, while hardly orienting crystal axes in parallel with the surface. Also when an oxide superconductor film is formed on a polycrystalline substrate of MgO, $SrTiO_3$ or $ZrO_2$, orientations of crystal planes are irregular in the film as formed. Since a superconducting current is inhibited by grain boundaries, a thin film which is formed on a polycrystalline substance by a conventional technique cannot attain sufficient superconductivity.

Figure 5:
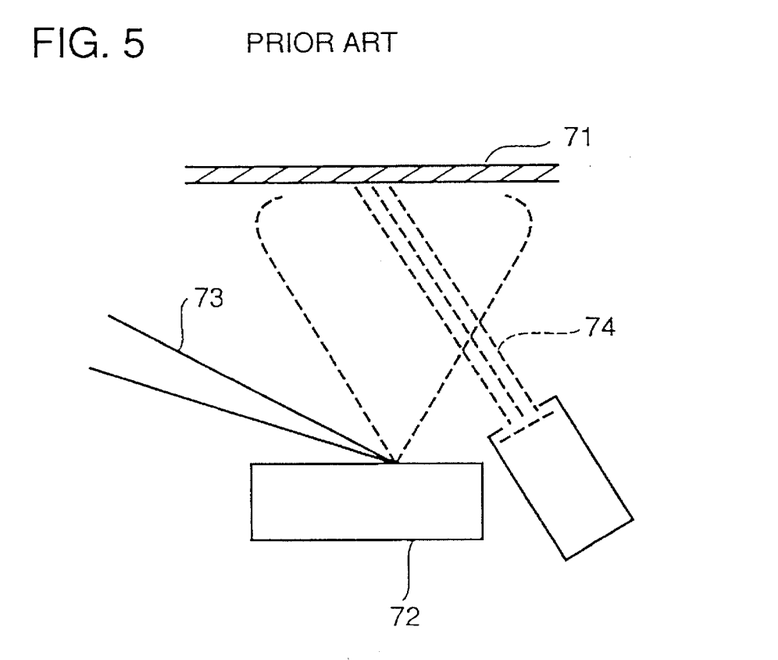
FIG. 5 is a model diagram showing the prior technique employing both of ion beam application and laser deposition.

In order to overcome such a disadvantage, there has recently been reported a method combining laser deposition and ion beam application (refer to Proceedings for 49th Teionkougaku-Choudendou Gakkai (Meeting on Cryogenics and Superconductivity), Spring 1993, p. 134). As shown in FIG. 5, according to this method, an intermediate layer of yttria stabilized zirconia (YSZ) is formed on a Hastelloy C276 tape 71 in a laser deposition device carrying out ion beam application. In this method, a YSZ target 72 is irradiated with a laser beam 73 for deposition, while the tape 71 is irradiated with a $Kr^+$ ion beam 74 from a prescribed direction, to forcibly order crystals as grown. This literature reports that it has been possible to form a YSZ layer having crystal axes which are ordered in a plane parallel to the substrate by this method.

However, this method requires an ion beam gun, and hence the device as well as the process for the deposition are complicated. Further, it is difficult to stably drive the unit continuously for a long time by this method.

SUMMARY OF THE INVENTION

An object of the present invention is to provide a novel method which can deposit a film strongly orienting specific crystal axes on a polycrystalline or amorphous base material surface.

Another object of the present invention is to deposit a thin film strongly orienting specific crystal axes on a polycrystalline or amorphous base material surface in a simpler device through a simpler process.

Still another object of the present invention is to provide a method which can deposit an intermediate layer and a superconducting layer strongly orienting specific crystal axes on a polycrystalline or amorphous base material surface in a simpler device through a simpler process.

The present invention is directed to form a thin film in accordance with laser ablation of irradiating a target with a laser beam thereby depositing a substance which is scattered from the target on a base material surface. The base material surface consists essentially of a polycrystalline or amorphous material. According to the present invention, specific conditions are prepared for formation of the thin film. The specific conditions are those which can form a film orienting a first specific crystal axis substantially perpendicularly to the base material surface in such arrangement that the target surface which is irradiated with the laser beam and the base material surface are substantially parallel to each other. According to the present invention, a film is deposited on the base material surface, which is inclined at a prescribed angle with respect to the target surface, under the specific conditions. The base material surface is so inclined at the prescribed angle as to form a single-crystalline film on the base material surface through the tendencies of orienting the first specific crystal axis in a direction substantially perpendicular to the target surface and orienting a second specific crystal axis in a direction substantially perpendicular to the base material surface in the film as deposited. Due to these tendencies, it is possible to orient a specific axis also in a direction substantially parallel to the base material surface.

The inventors have discovered that it is possible to orient a specific crystal axis also in a direction substantially parallel to the base material surface by simply inclining the base material surface at a prescribed angle with respect to the target surface through the aforementioned specific film forming conditions. The specific conditions include the species of the gas, the gas pressure and the substrate temperature employed for laser ablation. The film forming conditions are varied with the material for the film to be deposited, the crystal axes of the film to be deposited, the material for the substrate for the deposition, and the like. While it may be possible to form a film of a certain material through a gas of a certain species, at a certain gas pressure and at a certain substrate temperature, for example, a gas of another species, another gas pressure or another substrate temperature is necessary for forming a film of another material. While it may be possible to deposit a film of a certain material orienting a specific crystal axis through a gas of a certain species, at a certain gas pressure and at a certain substrate temperature, further, a different gas pressure or a different substrate temperature is necessary for orienting another crystal axis through the same material. In any case, however, it is possible to form a single-crystalline film on the base material surface through the aforementioned tendencies of orienting the first specific crystal axis and orienting the second specific axis substantially perpendicularly to the base material surface by simply inclining the base material surface at a prescribed angle with respect to the target surface, by employing the conditions which can form a film orienting a specific crystal axis substantially perpendicularly to the base material surface in such arrangement that the target surface and the base material surface are substantially parallel to each other. It is also possible to orient a specific crystal axis in a plane which is parallel to the substrate surface. The inclination of the base material surface can be set in the range of the angle formed by the first and second crystal axes ±20°, for example.

The present invention also provides a method of forming an intermediate layer and an oxide superconductor layer on a polycrystalline or amorphous base material surface by laser ablation. Also in this method, prepared are specific conditions which can form a film orienting a first specific crystal axis substantially perpendicularly to a base material surface in such arrangement that a target surface which is irradiated with a laser beam is substantially parallel to the base material surface. The base material surface is inclined at a prescribed angle with respect to the target surface, so that a first film is deposited on the inclined base material surface under the specific conditions. Then, a second film consisting essentially of an oxide superconductor is deposited on the first film. The single-crystalline first film is formed on the base material surface through the tendencies of orienting a first specific crystal axis in a direction substantially perpendicular to the target surface and orienting a second specific crystal axis in a direction substantially perpendicular to the base material surface by inclining the base material surface at a prescribed angle, as hereinabove described. Due to these tendencies, further, it is possible to orient a specific crystal axis also in a direction substantially parallel to the base material surface in the first film. The second film is epitaxially grown in accordance with the crystal structure of the first film. This process is applicable to preparation of an oxide superconducting wire or an oxide superconducting element.

Further, it is possible to apply the present invention to formation of an yttrium-based oxide superconducting film itself by employing a condition not reacting the base material with the oxide superconductor or by employing a base material provided with an antireaction layer. In this case, for example, a polycrystalline base material which is provided on its surface with an antireaction layer of amorphous yttria stabilized zirconia (YSZ) is employed as the base material. Then, prepared are the conditions which can form an yttrium-based oxide superconducting film orienting <103> or <013> substantially perpendicularly to the base material surface as the first specific crystal axis. Then, the base material surface is inclined at a prescribed angle to form an yttrium-based oxide superconductor under the aforementioned conditions, whereby a <001> axis is oriented perpendicularly to the base material surface as the second specific crystal axis, and <100> or <010> is oriented substantially parallel to the base material surface.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
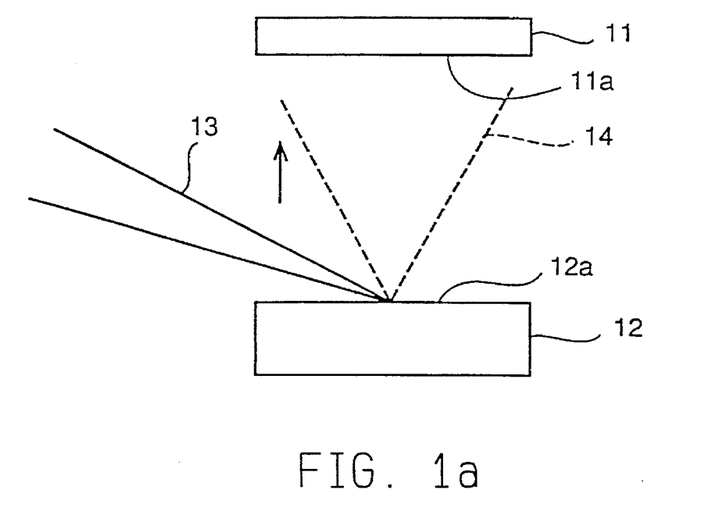
FIG. 1 including (a) and (b) is a model diagram for illustrating an exemplary method according to the present invention.

FIG. 1(a) illustrates laser ablation which is most generally employed. A substrate 11 is arranged in parallel with a target 12. The target 12 is irradiated with a laser beam 13, so that a plasma 14 (called a plume) is generated in a direction substantially perpendicular to a target surface 12a as shown in FIG. 1(a), regardless of the angle of incidence of the laser beam 13. Thus, particles contained in the plasma 14 are substantially perpendicularly incident upon the substrate 11 and deposited thereon.

In this arrangement, the crystal axis which is oriented in a direction perpendicular to the substrate 11 is varied with the temperature of the substrate, the species and the pressure of the atmosphere gas as employed, the film forming rate and the like. When specific conditions are selected, however, a certain axis is oriented perpendicularly to the substrate 11. In a direction parallel to a substrate surface 11a, on the other hand, all conditions are isotropic and hence deposited crystals are at random orientations in relation to the direction in the substrate surface 11a.

Figure 1B:
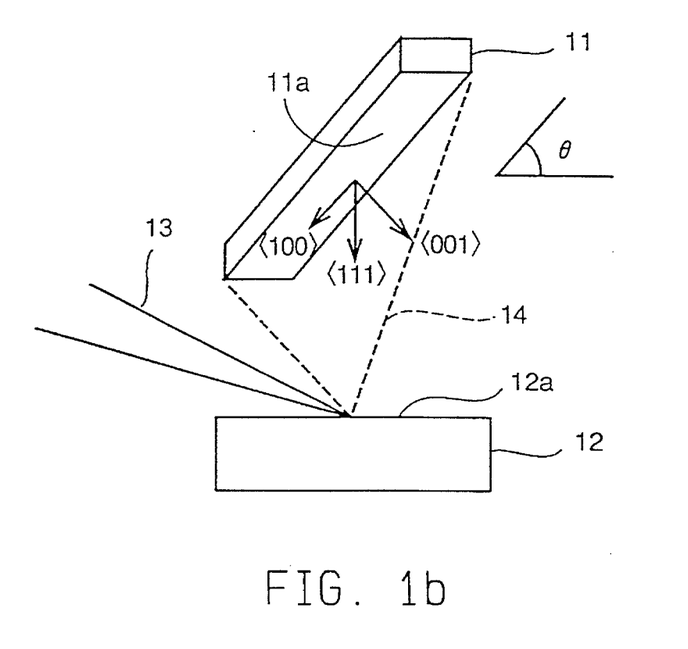

In the arrangement shown in FIG. 1(a), the conditions such as the substrate temperature, the gas pressure etc. are so decided that a crystal axis of a cubic oxide tends to orientate perpendicularly to the substrate surface 11b. Then, the substrate 11 is inclined for laser deposition under these conditions, as shown in FIG. 1(b). When the inclination θ is 55°, for example, a <001> axis tends to orientate perpendicularly to the substrate surface 11a. Under the conditions, further, a <111> axis tends to orientate in the direction of scattering of particles, i.e., in a direction substantially perpendicular to the target surface 12a. In accordance with these tendencies, a <100> axis is strongly orderly oriented in a plane parallel to the substrate surface 11a. Consequently, a single-crystalline film is obtained. The inclination of 55° is substantially equal to the angle which is formed by the <111> axis and the <100> or <001> axis.

Figure 2A:
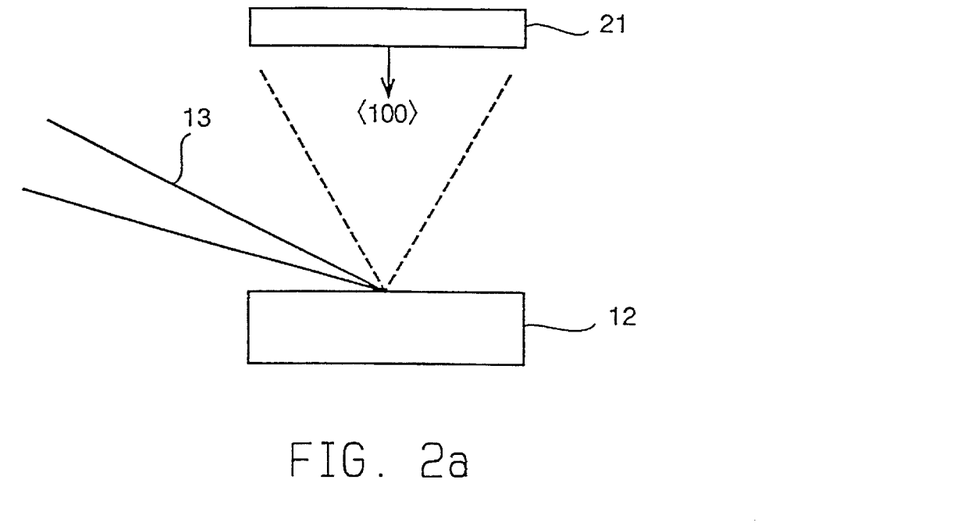
FIG. 2 including (a) and (b) is a model diagram for illustrating another exemplary method according to the present invention.
Figure 2B:
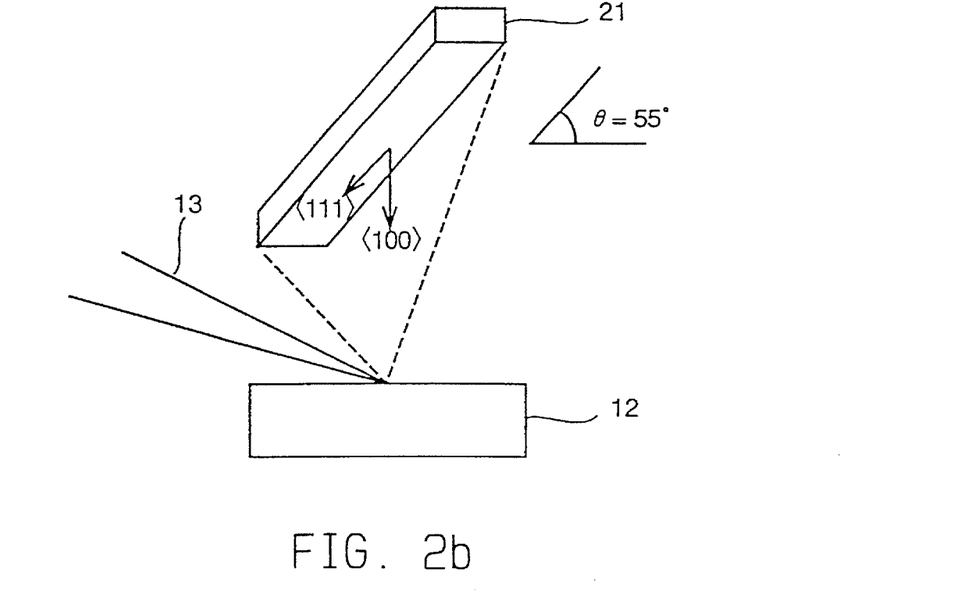

A similar action is effected also under conditions for orienting another crystal axis perpendicularly to a substrate surface. Referring to FIG. 2(a), when film forming conditions for orienting a <100> axis perpendicularly to a substrate 21 are employed in parallel arrangement of the substrate 21 and a target 12, for example, a film strongly orienting a <111> axis in a plane substantially parallel to the substrate surface is deposited on the substrate 21 which is inclined at an angle of 55°, as shown in FIG. 2(b). In this case, the axial relation is inverted with respect to the aforementioned case.

Figure 3A:
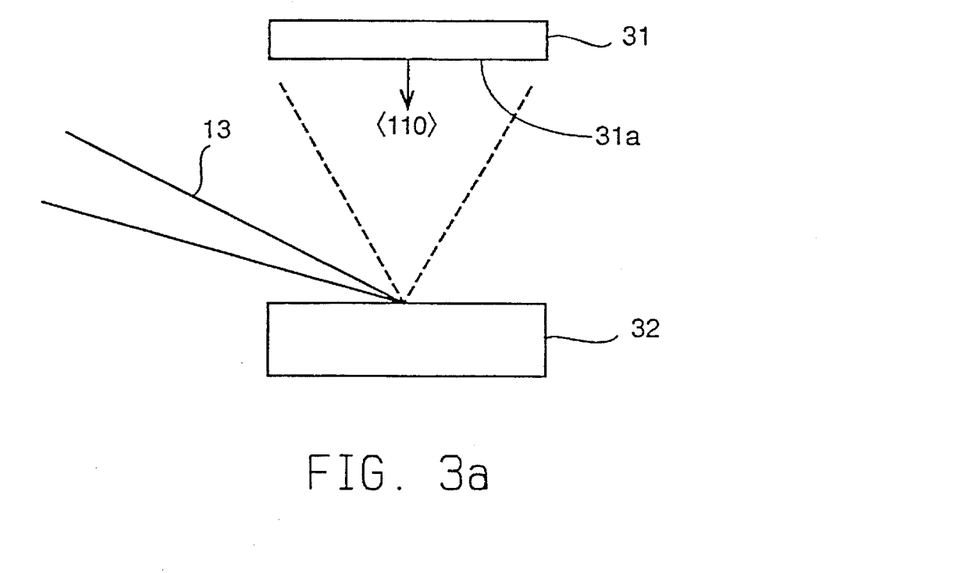
FIG. 3 including (a) and (b) is a diagram for illustrating still another exemplary method according to the present invention.
Figure 3B:
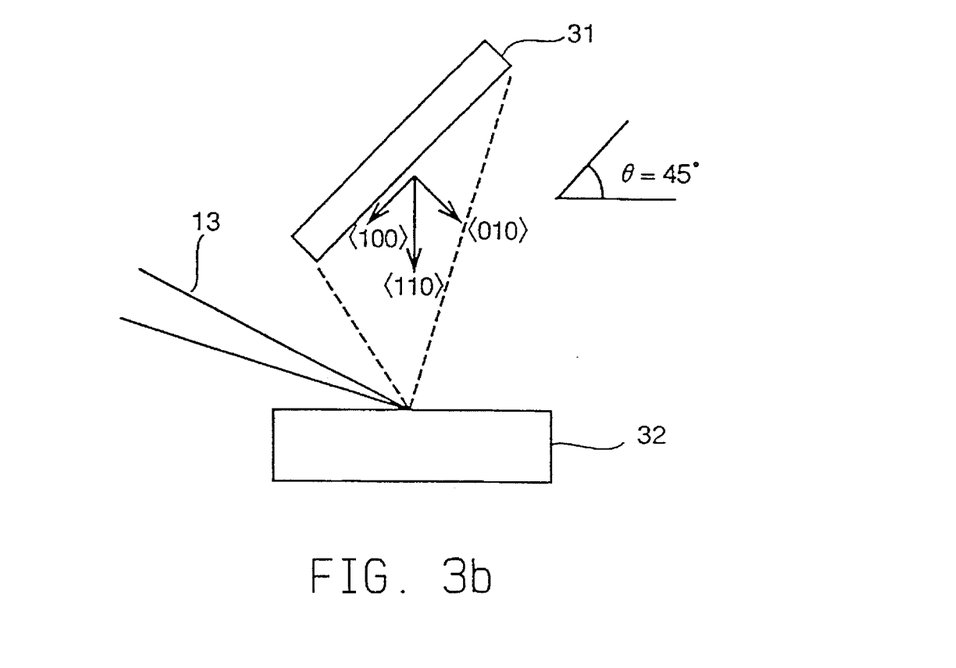

Further, as shown in FIG. 3(a), it is possible to employ film forming conditions for orienting a <110> axis perpendicularly to a substrate surface 31a of a substrate 31 in parallel arrangement of the substrate 31 and a target 32. When laser deposition is performed on the substrate 31 which is inclined at an angle of 45° under the film forming conditions, a <100> axis is orderly oriented in a plane which is substantially parallel to the substrate surface 31a through tendencies of strongly orienting the <110> axis and orienting a <010> axis perpendicularly to the substrate 31. The inclination of 45° is an angle which is formed by the <100> or <010> axis and the <110> axis.

As hereinabove described, it is possible to orient a specific crystal axis particularly in a direction parallel to the substrate surface by inclining the substrate at an angle which is set in accordance with the relation between the two crystal axes. This orientation is conceivably facilitated by tendencies of orienting the specific crystal axis in the direction scattering particles of the plume and spontaneously orienting another specific axis in the direction perpendicular to the base material surface. In order to deposit a film of a specific crystal form, it is preferable to employ film forming conditions for orienting one crystal axis in the specific crystal form in the direction scattering plume particles, i.e., the direction perpendicular to the target surface, and to incline the substrate at an angle, which is formed by another crystal axis in the specific crystal form and the aforementioned crystal axis, with respect to the target surface.

As hereinabove described, the substrate is preferably inclined at the angle which is formed by the two crystal axes. However, it is also possible to form a single-crystalline film by employing an angle which is slightly displaced from the aforementioned angle. When film forming conditions capable of orienting a <111> axis are employed, for example, it is possible to laser-deposit a cubic form film orienting a <100> axis on a substrate surface which is inclined at an angle in the range of 40° to 70°. When film forming conditions capable of orienting a <100> axis are employed, on the other hand, it is possible to deposit a cubic form film orienting a <111> axis on a substrate surface which is inclined at an angle in the range of 45° to 70°. When film forming conditions capable of orienting a <110> axis are employed, further, it is possible to obtain a cubic form film orienting a <100> axis by inclining the substrate surface at an angle in the range of 30° to 70°. On the other hand, it is also possible to form a cubic form film orienting a <110> axis by employing film forming conditions for orienting a <100> axis. At this time, the substrate can be inclined at an angle in the range of 30° to 70°.

According to the present invention, the thin film can be formed on base materials of various materials having various dimensions and shapes. The base material may consist of a single material or a composite material. It is also possible to employ a base material prepared by coating the surface of a specific material.

Figure 4:
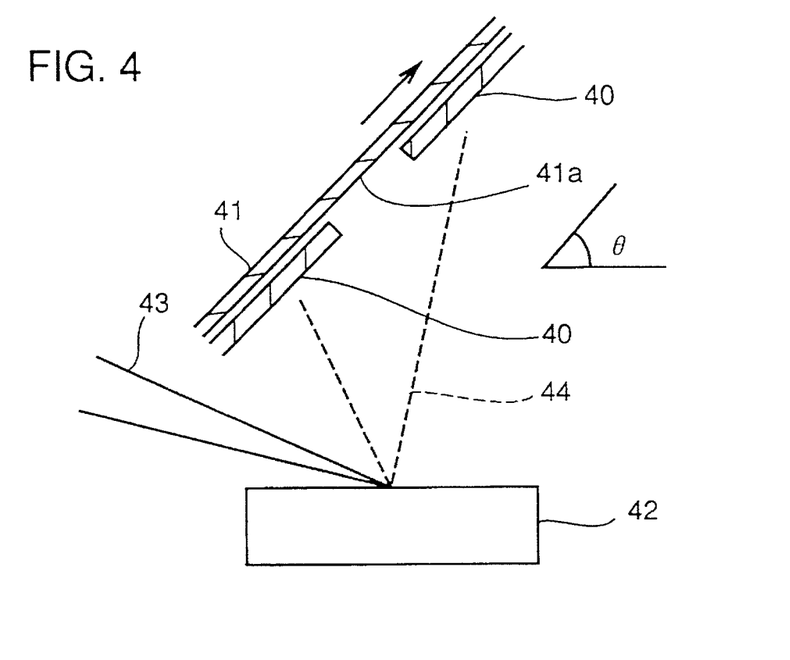
FIG. 4 is a model diagram showing a process of forming a single-crystalline thin film on a tape-shaped base material in accordance with the present invention.

A metal tape is preferably employed as the base material. A preferable metal can be prepared from hastelloy, stainless, nickel or the like. In order to form a thin film on a long metal tape, it is possible to carry out laser deposition while moving the base material along its longitudinal direction. As shown in FIG. 4, for example, a tape 41 can be moved while partially covering the tape 41 with masks 40, for continuously exposing the tape 41 to a plume 44. At this time, a tape surface 41a is inclined at a prescribed angle θ with respect to a surface of a target 42. Particles which are generated by irradiating the target 42 with a laser beam 43 are deposited on the tape 41 as moved. At this time, it is also possible to deliver the tape 41 from a first bobbin for carrying out laser deposition while taking up the same on a second bobbin.

An excimer laser is preferably employed for laser ablation. The excimer laser is preferably prepared from a KrF excimer laser of 248 nm in wavelength or an ArF excimer laser of 193 nm in wavelength. The target serving as a material for the thin film can be prepared from various materials. An oxide which can present a cubic form, particularly a metallic oxide, is preferably employed as the target in the present invention.

In order to finally form an oxide superconductor film on a base material, it is preferable to coat the base material with a film which is inactive with respect to the superconductor, so that the element forming the base material is not reacted with the oxide superconductor. Such a film can consist essentially of yttria stabilized zirconia, cerium oxide, or magnesium oxide, for example. A film consisting essentially of such a material can also be formed according to the present invention. In this case, the target is made of this material. When a single-crystalline film is formed in relation to this material, an oxide superconductor film can be epitaxially grown thereon.

On the other hand, an oxide superconductor can be directly deposited on a base material by employing conditions allowing no reaction between the base material and the oxide superconductor or providing an antireaction layer on the base material. The oxide superconductor is preferably prepared from an yttrium-based oxide superconductor such as $Yba_2Cu_3O_x$. When such an yttrium-based superconductor is deposited in accordance with the present invention, it is possible to employ conditions capable of forming a film orienting a <103> or <013> axis substantially perpendicularly to the base material surface in substantially parallel arrangement of the target surface and the base material surface. Under the conditions, the base material surface can be inclined at 30° to 70°, preferably at 40° to 50°, more preferably at 45° with respect to the target surface. It is possible to form a superconductor film strongly orienting a <100> axis in a plane substantially parallel to the substrate surface while strongly orienting a <001> axis perpendicularly to the base material surface.

Throughout the specification, Miller indices are indicated by convention. A specific crystal axis is expressed in [hk1]. There are present some orientations which are crystallographically equivalent to the orientation expressed in [hk1] depending on the symmetric property of the crystal, all such axes are expressed in <hk1>. A specific crystal plane is expressed in (hk1), and the planes which are crystallographically equivalent thereto are generically expressed in {hk1}.

EXAMPLES

Example 1

A thin film of yttria stabilized zirconia (YSZ) was formed on a small piece of a mirror-polished hastelloy tape by laser ablation employing a KrF excimer laser of 248 nm in wavelength.

First, substrates and targets were arranged in parallel with each other as shown in FIG. 1(a), and YSZ films were deposited at various substrate temperatures and gas pressures in the ranges of the room temperature to 800° C. and 1 to 200 mTorr respectively. At this time, laser energy density values were set at 1.5 to 3.3 J/cm$^2$, while laser repetitive rates were set at 1 to 100 Hz. The obtained YSZ films were investigated by X-ray diffraction, to confirm that YSZ most strongly orients a <111> axis with respect to the substrate surface under conditions combining the substrate temperature of 700° C. and the oxygen gas pressure of 100 mTorr. Further, it was possible to obtain a sufficiently strong <111> orientation by employing conditions of a substrate temperature and an oxygen gas pressure in the ranges of 400° to 800° C. and 20 to 150 mTorr respectively.

A small tape piece was inclined at an angle of 55° as shown in FIG. 1(b), to similarly form a YSZ thin film under conditions of a temperature of 700° C. and a pressure of 100 mTorr. The obtained film was evaluated by X-ray diffraction, whereby a peak strongly exhibiting the orientation of a <100> axis was observed while no peak exhibiting the orientation of a <111> axis was observed. Consequently, it was clarified that the <100> axis was strongly oriented in a plane parallel to the substrate surface. A similar small tape piece was inclined at another angle to deposit a film, whereby a peak exhibiting the orientation of a <100> axis was observed at 55°±15°, i.e., in the range of 40° to 70° in X-ray diffraction. The angle of 55° is substantially equal to that formed by the <111> and <100> axes.

YSZ films formed on substrates which were inclined at various angles were investigated by an X-ray pole figure technique respectively. Table 1 shows distributions (half-band widths) of <100> axes in planes parallel to the substrates obtained as the result. It is understood that the <100> axes were ordered in the planes parallel to the substrate surfaces in the range of inclinations of 40° to 70°. It has been clarified that a single-crystalline YSZ film can be obtained in this range.

TABLE 1

| Inclination (°) | 0 | 20 | 30 | 40 | 55 | 70 | 80 |
|---|---|---|---|---|---|---|---|
| Half-Band Width (°) of Orientation Distribution of <100> Axis in Plane Parallel to Substrate Surface | * | * | ±30 | ±12 | ±7 | ±15 | ** |

*oriented at random
**no orderly orientation of <100> axis was recognized

Example 2

YSZ films were deposited under various substrate temperatures and oxygen gas pressures similarly to Example 1, to confirm that a <100> axis is strongly oriented perpendicularly to the substrate surface through combination of the room temperature and a pressure of 2 mTorr. A film formed under these conditions was evaluated by an X-ray pole figure technique, whereby it was clarified that the crystal orientation was at random in a plane parallel to the substrate.

Small tape pieces were inclined at various angles, to form YSZ thin films under the conditions of the room temperature and the gas pressure of 2 mTorr. The obtained films were analyzed by X-ray diffraction similarly to Example 1, whereby peaks exhibiting strong orientations of <111> were observed when the tape pieces were inclined at angles in the range of 45° to 70°. This is the range of 55°−10° to 55°+15°. The angle of 55° is substantially equal to that formed by the <100> and <111> axes.

The obtained films were investigated by an X-ray pole figure technique, similarly to Example 1. Table 2 shows the results. It is clearly understood from Table 2 that the <111> axes were excellently regularized in the planes parallel to the substrate surfaces at angles in the range of 45° to 70°. Thus, it has been clarified possible to obtain a single-crystalline YSZ thin film under the conditions of the room temperature and the gas pressure of 2 mTorr at an inclination in the range of 45° to 70°.

TABLE 2

| Inclination (°) | 0 | 20 | 30 | 40 | 45 | 55 | 65 | 70 | 75 | 80 |
|---|---|---|---|---|---|---|---|---|---|---|
| Half-Band Width (°) of Orientation Distribution of <111> Axis in Plane Parallel to Substrate Surface | * | ** | ±30 | ±29 | ±12 | ±8 | ±8 | ±9 | ±12 | ±12 |

*oriented at random
**no orderly orientation of <111> axis was recognized

Example 3

YSZ films were deposited under various substrate temperatures and oxygen gas pressures similarly to Example 1, to confirm that a <110> axis was oriented perpendicularly to the substrate surface when a substrate temperature of 80° C. and an oxygen gas pressure of 20 mTorr were employed. Under these conditions, substrates were inclined at various angles to form YSZ thin films. Consequently, it was possible to obtain films strongly orienting <100> axes in planes parallel to the substrates when the inclinations were in the range of 30° to 60°. Relations between distributions of the <100> axes which were oriented in the planes parallel to the substrates and the inclinations were investigated by an X-ray pole figure technique. Table 3 shows the results. In this case, it was possible to obtain single-crystalline thin films in the range of 30° to 60° (45°−15° to 45°+15°).

TABLE 3

| Inclination (°) | 0 | 20 | 30 | 40 | 45 | 55 | 60 | 70 | 80 |
|---|---|---|---|---|---|---|---|---|---|
| Half-Band Width (°) of Orientation Distribution of <100> Axis in Plane Parallel to Substrate Surface | * | ** | ±12 | ±7 | ±7 | ±8 | ±12 | ±35 | ** |

*oriented at random
**no orderly orientation of <100> axis was recognized

As understood from the aforementioned Examples, it is possible to form a YSZ single-crystalline film on a hastelloy base material. On this film, it is possible to epitaxially grow an oxide superconductor, particularly an yttrium-based oxide superconductor in accordance with the present invention.

Example 4

An yttrium oxide superconducting thin film was formed on a small piece of a hastelloy tape which was previously provided with an amorphous yttria stabilized zirconia (YSZ) layer by laser ablation employing a KrF excimer laser of 248 nm in wavelength. First, the substrate and the target were arranged in parallel with each other as shown in FIG. 1(a) to form the yttrium-based oxide superconducting thin film under conditions of a substrate temperature of 600° C. and an oxygen gas pressure of 200 mTorr, whereby it was confirmed that a <103> or <013> axis was most strongly oriented perpendicularly to the base material surface. In laser ablation, the laser was prepared from a KrF excimer laser of 248 nm in wavelength, while the target was prepared from a Y-based sintered body expressed as $Y_1Ba_2Cu_3O_x$. Then, a small tape piece was inclined at an angle of 45° as shown in FIG. 1(b), to form an yttrium-based oxide superconducting film under the same conditions as the above. This film exhibited the orientation of a <001> axis in a direction substantially perpendicular to the base material surface, while the same exhibited no orientation of a <103> or <013> axis. It was clarified through investigation by an X-ray pole figure technique that a <100> or <010> axis was strongly oriented in a direction parallel to the base material surface. Table 4 shows relations between inclinations and orientation distributions of the <100> axes in the base material surfaces. It was possible to obtain yttrium-based oxide superconducting films having strong single-crystallinity at inclinations in the range of 30° to 70°.

TABLE 4

| Inclination (°) | 0 | 20 | 30 | 40 | 45 | 55 | 60 | 70 | 75 | 80 |
|---|---|---|---|---|---|---|---|---|---|---|
| Half-Band Width (°) of Orientation Distribution of <100> Axis in Plane Parallel to Substrate Surface | * | ** | ±20 | ±14 | ±8 | ±12 | ±18 | ±17 | ** | * |

*oriented at random
**no orderly orientation of <100> axis was recognized

Example 5

Cerium oxide and magnesium oxide were deposited under various substrate temperatures and oxygen gas pressures, similarly to Example 1. Consequently, it was confirmed that <100> axes were oriented perpendicularly to the substrate surfaces under conditions of 350° to 550° and 5 mTorr to 50 mTorr, and 400° C. to 600° C. and 50 mTorr to 100 mTorr respectively. The substrates were inclined at various angles, to form thin films of cerium oxide and magnesium oxide respectively under these conditions. Consequently, it was possible to obtain films strongly orienting <110> axes in planes parallel to the substrates when the inclinations were in the range of 30° to 70°.

Relations between the distributions of the <110> axes oriented in the planes parallel to the substrates and the inclinations were investigated by an X-ray pole figure technique. Table 5 shows the results.

TABLE 5

| Inclination (°) | 0 | 20 | 30 | 40 | 45 | 55 | 60 | 70 | 75 | 80 |
|---|---|---|---|---|---|---|---|---|---|---|
| (a) Cerium Oxide | | | | | | | | | | |
| Half-Band Width (°) of Orientation Distribution of <110> Axis in Plane Parallel to Substrate Surface | * | ** | ±24 | ±11 | ±5 | ±8 | ±10 | ±11 | ** | * |
| (b) Magnesium Oxide | | | | | | | | | | |
| Half-Band Width (°) of Orientation Distribution of <110> Axis in Plane Parallel to Substrate Surface | * | ** | ±18 | ±9 | ±6 | ±7 | ±8 | ±12 | ** | * |

*oriented at random
**no orderly orientation of <110> axis was recognized

Example 6

A small tape piece was inclined at 55° to form a YSZ thin film in the method of Example 1. A thin film of an yttrium-based oxide superconductor was formed on the YSZ film by laser ablation in substantially parallel arrangement of a substrate and a target. At this time, the substrate temperature and the oxygen gas pressure were set at 750° C. and 300 mTorr respectively. The YSZ thin film regularized its orientations with a half-band width of an in-plane <100> axis of ±7° similarly to Example 1, and the thin film of the yttrium-based oxide superconductor formed thereon oriented a c-axis perpendicularly to the substrate surface while orienting an a-axis at a half-band width of ±6° as the orientation distribution in a plane parallel to the substrate. Thus, it can be inferred that the yttrium-based superconducting film, which was a second film, was epitaxially grown with respect to the first film. This film exhibited a critical current density of $3.2 \times 10^5$ A/cm$^2$ in liquid nitrogen.

Example 7

A small tape piece was inclined at 45° to form a YSZ thin film in the method of Example 3. A thin film of an yttrium-based oxide superconductor was formed thereon by laser ablation, in substantially parallel arrangement of a substrate and a target. Forming conditions were identical to those in Example 6. The YSZ thin film regularized its orientations at a half-band width of ±7° of an in-plane <100> axis similarly to Example 3, and the thin film of the yttrium-based oxide superconductor formed thereon oriented a c-axis perpendicularly to the substrate surface while orienting an a-axis at a half-band width of ±5° as the orientation distribution in the plane. Thus, it can be inferred that the first and second films were in an epitaxial relation to each other, similarly to Example 6. This film exhibited a critical current density of $4.3 \times 10^5$ A/cm$^2$ in liquid nitrogen.

According to the present invention, as hereinabove described, it is possible to form a single-crystalline thin film on a polycrystalline or amorphous base material through a simple process with the minimum equipment required for laser deposition. When the base material is prepared from a long metal tape, it is possible to form a single-crystalline thin film consisting essentially of yttria stabilized zirconia, magnesium oxide or cerium oxide thereon along the longitudinal direction of the tape. When an oxide superconductor is heteroepitaxially grown on this thin film, it is possible to form a superconductor exhibiting a high critical current density. It is also possible to form a superconductor having high single-crystallinity and exhibiting a high critical current density by applying the present invention to formation of an oxide superconducting film itself. When the superconductor is formed along the longitudinal direction of the tape, it is possible to obtain a superconducting wire. The present invention is particularly useful for a process of manufacturing an oxide superconducting wire.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a single-crystalline thin film, comprising the steps of:

preparing film forming conditions capable of forming a film orienting a first specific crystal axis substantially perpendicularly to a base material surface in substantially parallel arrangement of a target surface being irradiated with a laser beam and said base material surface in accordance with laser ablation of irradiating a target with said laser beam thereby depositing a substance being scattered from said target on said base material surface;

inclining said base material surface with respect to said target surface; and depositing a film on said inclined base material surface under said film forming conditions, said base material surface consisting essentially of a polycrystalline or amorphous material, said base material surface being so inclined as to form a single-crystalline film on said base material surface through tendencies of orienting said first specific crystal axis in a direction substantially perpendicular to said target surface and orienting a second specific crystal axis in a direction substantially perpendicular to said base material surface in said film as being deposited.

2. The method in accordance with claim 1, being capable of orienting a specific crystal axis also in a direction substantially parallel to said base material surface in said deposited film.

3. The method in accordance with claim 1, wherein said base material surface is inclined at a prescribed angle in the range of an angle being formed by said first and second crystal axes ±20°.

4. The method in accordance with claim 1, wherein said base material consists essentially of a metal tape, and said deposited film consists essentially of a compound selected from the group consisting of yttria stabilized zirconia, cerium oxide and magnesium oxide.

5. The method in accordance with claim 1, wherein said deposited film consists essentially of an yttrium-based oxide superconductor.

6. The method in accordance with claim 1, wherein said first crystal axis is <111>, a cubic form film orienting <100> substantially in parallel with said base material surface being deposited through a tendency of orienting <001> as said second crystal axis by inclining said base material surface at an angle in the range of 40° to 70°.

7. The method in accordance with claim 1, wherein said first crystal axis is <103> or <013> of an yttrium-based oxide superconductor, said film being deposited through a tendency of orienting <001> of said yttrium-based oxide superconductor as said second crystal axis by inclining said base material surface at an angle in the range of 30° to 70°.

8. The method in accordance with claim 1, wherein said first crystal axis is <100>, a cubic form film orienting <111> in a direction substantially parallel to said base material surface being deposited by inclining said base material surface at an angle in the range of 45° to 70°.

9. The method in accordance with claim 1, wherein said first crystal axis is <110>, a cubic form film orienting <100> in a direction substantially parallel to said base material surface being deposited through a tendency of orienting <010> as said second crystal axis by inclining said base material surface at an angle in the range of 30° to 70°.

10. The method in accordance with claim 1, wherein said first crystal axis is <100>, a cubic form film orienting <110> in a direction substantially parallel to said base material surface being deposited by inclining said base material surface at an angle in the range of 30° to 70°.

11. A method of forming a single-crystalline thin film, comprising the steps of:

preparing film forming conditions capable of forming a film orienting a first specific crystal axis substantially perpendicularly to a base material surface in substantially parallel arrangement of a target surface being irradiated with a laser beam and said base material surface in accordance with laser ablation of irradiating a target with said laser beam thereby depositing a substance being scattered from said target on said base material surface;

inclining said base material surface with respect to said target surface;

depositing a first film on said inclined base material surface under said film forming conditions; and depositing a second film consisting essentially of an oxide superconductor on said first film, said base material surface consisting essentially of a polycrystalline or amorphous material, said base material surface being so inclined as to form a single-crystalline first film on said base material surface through tendencies of orienting said first specific crystal axis in a direction substantially perpendicular to said target surface and orienting a second specific crystal axis in a direction substantially perpendicular to said base material surface in said film as being deposited, said second film being epitaxially grown in accordance with the crystal structure of said first film.

12. The method in accordance with claim 11, being capable of orienting a specific crystal axis also in a direction substantially parallel to said base material surface in said first film.

13. The method in accordance with claim 11, wherein said first film consists essentially of a compound selected from the group consisting of yttria stabilized zirconia, cerium oxide and magnesium oxide.

14. The method in accordance with claim 11, wherein said second film consists essentially of an yttrium-based oxide superconductor.

15. The method in accordance with claim 11, wherein said first crystal axis is <111>, a cubic form film orienting <100> substantially in parallel with said base material surface being deposited as said first film through a tendency of orienting <001> as said second crystal axis by inclining said base material surface at an angle in the range of 40° to 70°.

16. The method in accordance with claim 11, wherein said first crystal axis is <110>, a cubic form film orienting <100> in a direction substantially parallel to said base material surface being deposited as said first film through a tendency of orienting <010> as said second crystal axis by inclining said base material surface at an angle in the range of 30° to 70°.

* * * * *